United States Patent
Mehrotra et al.

(10) Patent No.: US 6,735,754 B2
(45) Date of Patent: May 11, 2004

(54) METHOD AND APPARATUS TO FACILITATE GLOBAL ROUTING FOR AN INTEGRATED CIRCUIT LAYOUT

(75) Inventors: Sharad Mehrotra, Cedar Park, TX (US); Parsotam T. Patel, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 71 days.

(21) Appl. No.: 10/165,136

(22) Filed: Jun. 6, 2002

(65) Prior Publication Data

US 2003/0229876 A1 Dec. 11, 2003

(51) Int. Cl.$^7$ ................................................ G06F 17/50
(52) U.S. Cl. ............................. 716/13; 716/8; 716/10; 716/11; 716/12; 716/14
(58) Field of Search ....................... 716/8–14

(56) References Cited

U.S. PATENT DOCUMENTS

| | | | |
|---|---|---|---|
| 5,636,129 A | * 6/1997 | Her | 716/12 |
| 5,640,327 A | * 6/1997 | Ting | 716/7 |
| 5,729,469 A | * 3/1998 | Kawakami | 716/13 |
| 5,784,289 A | * 7/1998 | Wang | 716/8 |
| 5,838,583 A | * 11/1998 | Varadarajan et al. | 716/9 |
| 6,131,182 A | * 10/2000 | Beakes et al. | 716/8 |
| 6,324,674 B2 | * 11/2001 | Andreev et al. | 716/12 |
| 6,408,422 B1 | * 6/2002 | Hwang et al. | 716/3 |
| 6,415,422 B1 | * 7/2002 | Mehrotra et al. | 716/5 |
| 6,476,636 B1 | * 11/2002 | Lien et al. | 326/41 |
| 6,543,043 B1 | * 4/2003 | Wang et al. | 716/14 |

* cited by examiner

*Primary Examiner*—Vuthe Siek
(74) *Attorney, Agent, or Firm*—Park, Vaughan & Fleming LLP; Edward J. Grundler

(57) ABSTRACT

A system that facilitates generating a global routing for a layout of an integrated circuit operates by receiving a netlist to be routed. The system partitions this netlist into global signals, datapath signals, and control signals. Next, the system creates a tiling grid of the integrated circuit and routes connection nets between tiles within this grid. The system then selects an area within the integrated circuit larger than a tile in the first grid. The system creates a second grid of tiles smaller than the tiles of the first grid within this selected area. During this process, connection nets are routed between tiles on the second grid while routings within the first grid are maintained. The system merges connection nets within the first grid with connection nets within the second grid to form the global routing.

21 Claims, 2 Drawing Sheets

METHOD AND APPARATUS TO FACILITATE GLOBAL ROUTING FOR AN INTEGRATED CIRCUIT LAYOUT

BACKGROUND

1. Field of the Invention

The present invention relates to the process of laying out an integrated circuit. More specifically, the present invention relates to a method and an apparatus for global routing during layout of an integrated circuit.

2. Related Art

As rapid advances in semiconductor technology make it possible to incorporate larger amounts of circuitry onto a semiconductor chip, it is becoming increasingly harder to route signal lines between circuit components. In order to simplify the process of routing signal lines, the routing process is generally divided into a global routing operation, which is followed by a detailed routing operation. Global routing typically entails dividing the chip into rectangular tiles, mapping the connection points to the tile centers, and routing the connections over a tile adjacency graph (also called a global grid graph.) Global routing is generally much faster than detailed routing and gives valuable feedback about possible congestion problems in the design. Additionally, if routing capacities are assigned to the global tiles and the global routes are chosen to minimize the tile congestion with respect to these global capacities, the later detailed routing can be restricted to routing signals within these global routing tiles.

Typically, the global routing tiles are defined by placing imaginary vertical and horizontal cutlines across the entire layout area. The resulting checkerboard pattern describes the global routing tiles. Using fewer cutlines results in larger tiles and faster global routing, though with less accuracy in the congestion estimation and potentially more conflicts in the later detailed routing operation. Using a larger number of cutlines produces smaller tiles and leads to better routing, but takes considerably more run-time.

Different portions of the chip are designed in different ways. For datapath design, the circuits are placed in uniform width stacks. Datapath connections are typically forged within the width of the stacks to minimize congestion and electrical problems. For overall chip design, there are fewer restrictions on wiring. However, the chip size may be so large that a detailed design of the entire chip is not feasible.

In this case, the chip may be partitioned hierarchically into smaller blocks, with each block designed separately and block-to-block connections located at the boundary. However, the block boundary connections need to be assigned. Global routing may be used to assign the block boundary connections by first removing the block boundaries and performing a global routing for all nets. A given block boundary is then intersected with a given global path of a net to define a boundary connection within this intersection region for the net.

For both datapath and hierarchical wiring, it is desirable to have small tiles sizes. For datapaths, the tile width should correspond to the bit-width so that nets may be restricted to within their bit-stack. For hierarchical blocks, having smaller tiles provides tighter restrictions on the block boundary pins. However, using these smaller tile sizes to route the entire chip leads to prohibitively large run-times for global routing.

What is needed is a method and an apparatus that gives the benefit of routing with smaller tiles without the associated expense of excessive run-time.

SUMMARY

One embodiment of the present invention provides a system that facilitates generating a global routing for a layout of an integrated circuit. The system operates by first receiving a netlist to be routed. The system partitions this netlist into global signals, datapath signals, and control signals. Next, the system creates a first tiling grid of the integrated circuit and routes connection nets between tiles within the first tiling grid. The system then selects an area within the integrated circuit that includes a portion of the integrated circuit larger than a tile in the first tiling grid. The system also creates a second tiling grid of the selected area, wherein tiles of the second tiling grid are smaller than the tiles of the first tiling grid. Next, the system routes connection nets within the selected area. During this process, connection nets are routed between tiles on the second tiling grid while routings within the first tiling grid are maintained. Finally, the system merges connection nets within the first tiling grid with connection nets within the second tiling grid to form the global routing.

In one embodiment of the present invention, the system assigns boundary connections between the first tiling grid and the second tiling grid.

In one embodiment of the present invention, tiles of the first tiling grid are rectangular.

In one embodiment of the present invention, tiles of the second tiling grid are rectangular.

In one embodiment of the present invention, the selected area includes a datapath, and the second tiling grid tile on the datapath is one bit wide.

In one embodiment of the present invention, the area includes a control signal area, and the second tiling grid tile on the control signal area is assigned a specified size.

In one embodiment of the present invention, selecting the area includes selecting a set of areas where each area in the set of areas is routed separately.

In one embodiment of the present invention, the method involves routing connection nets that pass through the selected area without connecting within the selected area while routing other connection nets within the area.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Router

Figure 1:
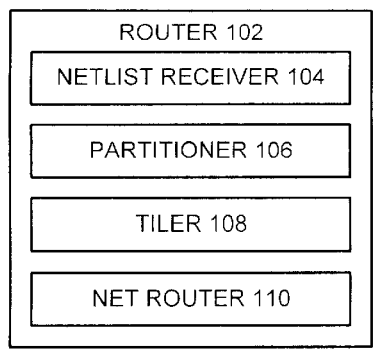
FIG. 1 illustrates router 102 in accordance with an embodiment of the present invention.

FIG. 1 illustrates router 102 in accordance with an embodiment of the present invention. Router 102 includes netlist receiver 104, partitioner 106, tiler 108, and net router 110. Router 102 can generally include any type of computer system, including, but not limited to, a computer system based on a microprocessor, a mainframe computer, a digital signal processor, a portable computing device, a personal organizer, a device controller, and a computational engine within an appliance.

Netlist receiver 104 receives a netlist for an integrated circuit from a designer or a design tool. The netlist is typically in a hardware design format such as very high-speed integrated circuit hardware description language (VHDL). This netlist describes the components and the interconnections of the integrated circuit and includes datapaths, global interconnections, and control signals. The datapaths are typically areas with very regular structures and dense circuit interconnections.

Partitioner 106 partitions the netlist into global, datapath, and control signal nets. Partitioning the netlist provides a means for determining which areas can benefit from a second tiling with smaller tiles during global routing.

Figure 2:
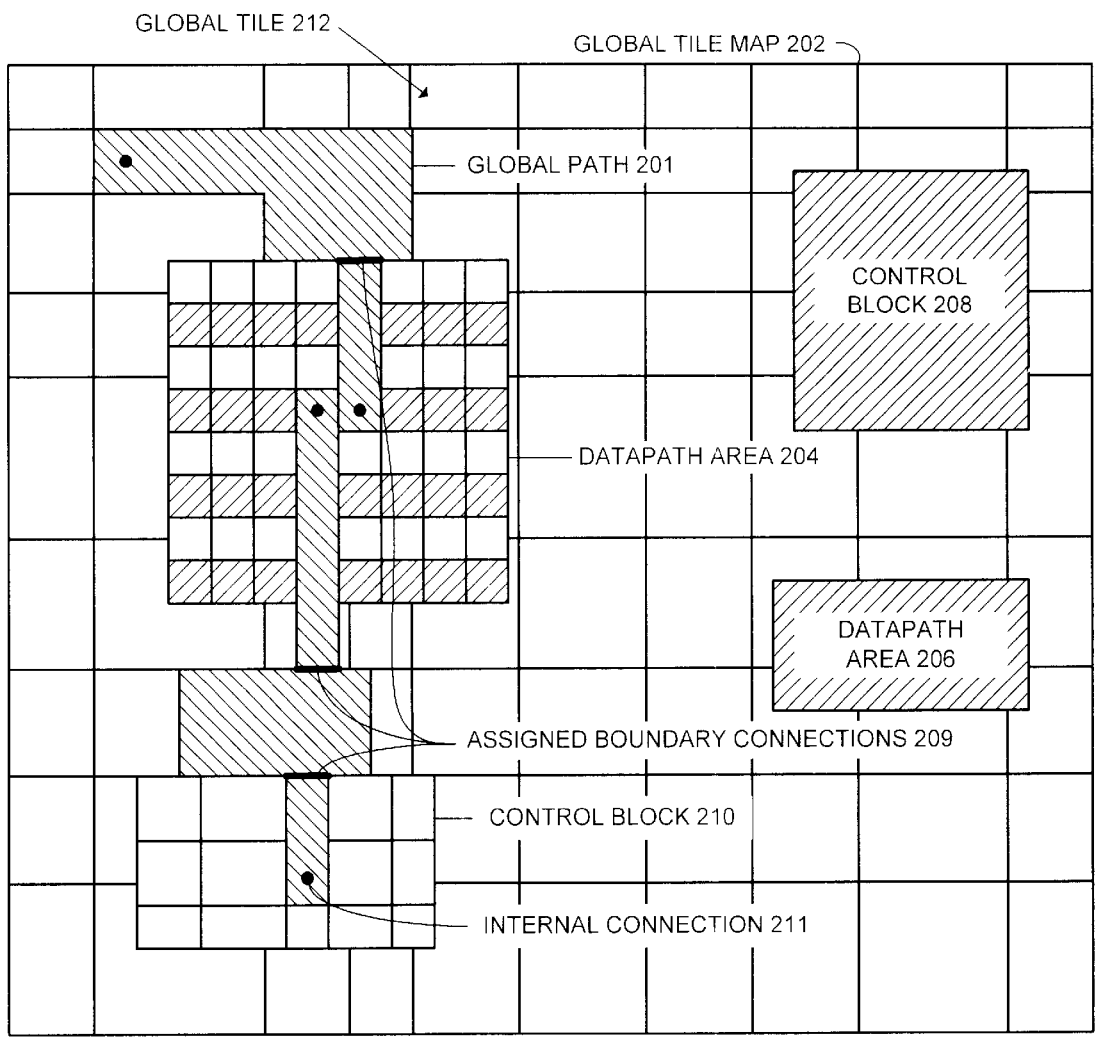
FIG. 2 illustrates global tile map 202 in accordance with an embodiment of the present invention.

Tiler 108 provides a means to tile an area. Tiler 108 places imaginary horizontal and vertical cut lines across a surface to provide a checkerboard pattern for routing the nets on the surface. Note that the tiles created by tiler 108 do not need to be uniform in size. The tiling can result in irregular tile sizes as shown in FIG. 2. Tiling provides horizontal and vertical lanes for routing signal, control, and power lines between separate tiles on the surface of a chip, or within selected areas that have been identified by partitioner 106. Tiler 108 can provide global tiling for the chip and local tiling for selected areas.

Net router 110 routes the interconnections between the various tiles as described below in conjunction with FIGS. 2–4. Net router 110 provides a global routing of the various nets so that detailed routing can be accomplished in much less time.

Global Tile Map 202

FIG. 2 illustrates global tile map 202 in accordance with an embodiment of the present invention. Global tile map 202 illustrates the tiled surface of a chip. Tiler 108 has established horizontal and vertical cut lines to provide a tiling so that net router 110 can provide a global routing for the various nets within the netlist. Global tile 212 is representative of the tiles provided by tiler 108.

Partitioner 106 identifies datapath areas 204 and 206 and control blocks 208 and 210, which have a regular structure and can benefit from a more detailed tiling. After net router 110 has routed the nets on global tile map 202, tiler 108 tiles these separate areas and net router 110 routes the nets within these areas. During this routing process, the previous global routing is maintained. Upon completion of the routings in these areas, the routings are merged with the first routings on global tile map 202. Global path 201 is routed through datapath area 204 to control block 210. This net is coupled across assigned boundary connections 210 to internal connection 211 within control block 210. Note that during the congestion calculations net router 110 includes nets that pass through a tile but have no connection point within the tile.

Datapath Area

Figure 3:
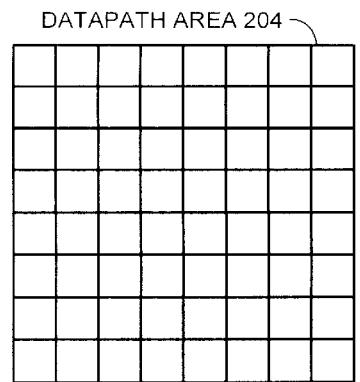
FIG. 3 illustrates datapath area 204 in accordance with an embodiment of the present invention.

FIG. 3 illustrates datapath area 204 in accordance with an embodiment of the present invention. Datapath area 204 is representative of the areas identified by partitioner 106 as being able to benefit from a more detailed tiling. Datapath area 204 is an area that has a very regular structure and can be tiled, typically, into bit wide structures such as bit slice 302. Note that the individual tiles are much smaller than global tile 212. This allows more accurate global routing without the expenditure of time required for using the smaller tiles for the entire chip. After net router 110 has routed the nets for datapath area 204 and the other identified areas, the routings from the global tiling and the tiling of the smaller areas are merged into a single global routing. Providing two levels of tiling and routing at the global routing stage allows detailed routing to be completed in much less time.

Performing Global Routing

Figure 4:
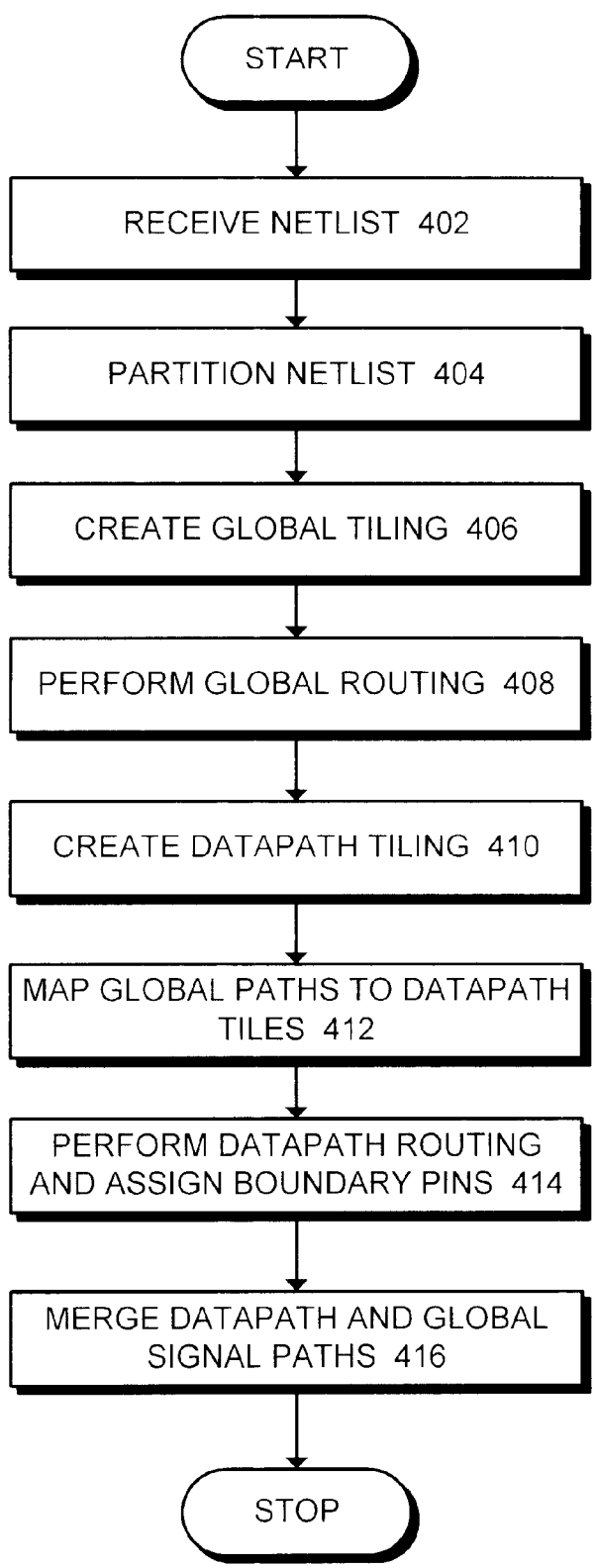
FIG. 4 is a flowchart illustrating the process of performing global routing of an integrated circuit in accordance with an embodiment of the present invention.

FIG. 4 is a flowchart illustrating the process of performing global routing of an integrated circuit in accordance with an embodiment of the present invention. The system starts when netlist receiver 104 receives a netlist (step 402). Next, partitioner 106 partitions the netlist as described above in conjunction with FIG. 1 (step 404).

After partitioner 106 has partitioned the netlist, tiler 108 creates a global tiling for the chip (step 406). Net router 110 then performs a routing within this global tiling (step 408).

Upon completion of this routing, tiler 108 creates a tiling for datapath areas 204 and 206 and control blocks 208 and 210 (step 410). Next, net router 110 maps the global paths to the datapath tiles (step 412). Net router 110 then performs routing within these selected areas and assigns the boundary pins (step 414). Finally, net router 110 merges the datapath and global signal paths (step 416).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for generating a global routing for a layout of an integrated circuit, comprising receiving a netlist to be routed;

partitioning the netlist into global signals, datapath signals, and control signals;

creating a first tiling grid of the integrated circuit;

routing connection nets within the first tiling grid, wherein connection nets are routed between tiles on the first tiling grid;

selecting a target area within the integrated circuit, wherein the target area includes a portion of the integrated circuit that is larger than a tile in the first tiling grid;

creating a second tiling grid in the target area, wherein tiles of the second tiling grid are smaller than tiles of the first tiling grid;

routing connection nets within the target area, wherein connection nets are routed between tiles on the second tiling grid, and wherein routings within the first tiling grid are maintained; and merging connection nets within the first tiling grid with connection nets within the second tiling grid to form the global routing, whereby merging the first tiling grid and the second tiling grid allows more accurate routing in the target area;

wherein while routing connection nets within the target area, the method further comprises accounting for connection nets that pass through the target area without connecting within the target area.

2. The method of claim 1, further comprising assigning boundary connections between the first tiling grid and the second tiling grid.

3. The method of claim 1, wherein the tile in the first tiling grid is rectangular.

4. The method of claim 1, wherein a tile in the second tiling grid is rectangular.

5. The method of claim 1, wherein the target area includes a datapath; and wherein a second tiling grid tile is one bit wide.

6. The method of claim 1, wherein the target area includes a control signal area; and wherein a second tiling grid tile is assigned a specified size.

7. The method of claim 1, wherein selecting the target area includes selecting a set of target areas; and wherein each area in the set of target areas is routed separately.

8. A computer-readable storage medium storing instructions that when executed by a computer cause the computer to perform a method for generating a global routing for a layout of an integrated circuit, comprising receiving a netlist to be routed;

partitioning the netlist into global signals, datapath signals, and control signals;

creating a first tiling grid of the integrated circuit;

routing connection nets within the first tiling grid, wherein connection nets are routed between tiles on the first tiling grid;

selecting a target area within the integrated circuit, wherein the target area includes a portion of the integrated circuit that is larger than a tile in the first tiling grid;

creating a second tiling grid in the target area, wherein tiles of the second tiling grid are smaller than tiles of the first tiling grid;

routing connection nets within the target area, wherein connection nets are routed between tiles on the second tiling grid, and wherein routings within the first tiling grid are maintained; and merging connection nets within the first tiling grid with connection nets within the second tiling grid to form the global routing, whereby merging the first tiling grid and the second tiling grid allows more accurate routing in the target area;

wherein while routine connection nets within the target area, the method further comprises accounting for connection nets that pass through the target area without connecting within the target area.

9. The computer-readable storage medium of claim 8, the method further comprising assigning boundary connections between the first tiling grid and the second tiling grid.

10. The computer-readable storage medium of claim 8, wherein the tile in the first tiling grid is rectangular.

11. The computer-readable storage medium of claim 8, wherein a tile in the second tiling grid is rectangular.

12. The computer-readable storage medium of claim 8, wherein the target area includes a datapath; and wherein a second tiling grid tile is one bit wide.

13. The computer-readable storage medium of claim 8, wherein the target area includes a control signal area; and wherein a second tiling grid tile is assigned a specified size.

14. The computer-readable storage medium of claim 8, wherein selecting the target area includes selecting a set of target areas; and wherein each area in the set of target areas is routed separately.

15. An apparatus for generating a global routing for a layout of an integrated circuit, comprising a receiving mechanism that is configured to receive a netlist to be routed;

a partitioning mechanism that is configured to partition the netlist into global signals, datapath signals, and control signals;

a creating mechanism that is configured to create a first tiling grid of the integrated circuit;

a routing mechanism that is configured to route connection nets within the first tiling grid, wherein connection nets are routed between tiles on the first tiling grid;

a selecting mechanism that is configured to select a target area within the integrated circuit, wherein the target area includes a portion of the integrated circuit that is larger than a tile in the first tiling grid;

wherein the creating mechanism is further configured to create a second tiling grid in the target area, wherein tiles of the second tiling grid are smaller than tiles of the first tiling grid;

wherein the routing mechanism is further configured to route connection nets within the target area, wherein connection nets are routed between tiles on the second tiling grid, and wherein routings within the first tiling grid are maintained;

wherein the routing mechanism is further configured to account for connection nets that pass through the target area without connecting within the target area; and a merging mechanism that is configured to merge connection nets within the first tiling grid with connection nets within the second tiling grid to form the global routing, whereby merging connection nets within the first tiling grid and connection nets within the second tiling grid allows more accurate routing in the target area.

16. The apparatus of claim 15, further comprising an assigning mechanism that is configured to assign boundary connections between the first tiling grid and the second tiling grid.

17. The apparatus of claim 15, wherein the tile in the first tiling grid is rectangular.

18. The apparatus of claim 15, wherein a tile in the second tiling grid is rectangular.

19. The apparatus of claim 15, wherein the target area includes a datapath; and wherein a second tiling grid tile is one bit wide.

20. The apparatus of claim 15, wherein the target area includes a control signal area; and wherein a second tiling grid tile is assigned a specified size.

21. The apparatus of claim 15, wherein selecting the target area includes selecting a set of target areas; and wherein each target area in the set of target areas is routed separately.

* * * * *